United States Patent
Cai

(10) Patent No.: US 11,153,979 B2
(45) Date of Patent: Oct. 19, 2021

(54) FOLDABLE DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventor: Zhenfei Cai, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/769,286

(22) PCT Filed: Apr. 3, 2020

(86) PCT No.: PCT/CN2020/083355
§ 371 (c)(1),
(2) Date: Jun. 3, 2020

(65) Prior Publication Data
US 2021/0289639 A1    Sep. 16, 2021

(30) Foreign Application Priority Data
Mar. 12, 2020   (CN) .......................... 202010168844.2

(51) Int. Cl.
*H05K 7/02*    (2006.01)
*H05K 7/04*    (2006.01)
*H05K 5/00*    (2006.01)
*G05D 16/16*   (2006.01)
*H05K 5/02*    (2006.01)

(52) U.S. Cl.
CPC .......... *H05K 5/0017* (2013.01); *G05D 16/16* (2013.01); *H05K 5/0217* (2013.01)

(58) Field of Classification Search
USPC ....................................................... 361/807
See application file for complete search history.

(56) References Cited

U.S. PATENT DOCUMENTS

| | | | |
|---|---|---|---|
| 2017/0196078 A1* | 7/2017 | Choi ..................... | H05K 5/0017 |
| 2018/0292860 A1* | 10/2018 | Siddiqui ............... | G06F 1/1618 |
| 2019/0082544 A1* | 3/2019 | Park ....................... | G09F 9/301 |
| 2019/0334114 A1* | 10/2019 | Park ....................... | G06F 1/203 |
| 2019/0346887 A1* | 11/2019 | Park ....................... | G06F 1/1652 |
| 2021/0141418 A1* | 5/2021 | Min ....................... | G06F 1/1616 |

\* cited by examiner

*Primary Examiner* — Hung S. Bui
(74) *Attorney, Agent, or Firm* — The Roy Gross Law Firm, LLC; Roy Gross

(57) ABSTRACT

A foldable display module is provided. The foldable display module includes a first support mechanism, a second support mechanism, a first flexible screen, a second flexible screen, a first deformable member, and a second deformable member. When the foldable display module is in a flat state, the first deformable member and the second deformable member both expand in volume, and a portion of the first flexible screen and the second flexible screen both extend to a gap and are seamlessly spliced.

16 Claims, 2 Drawing Sheets

FOLDABLE DISPLAY MODULE

FIELD OF INVENTION

The present invention relates to the field of display technologies, and in particular, to a foldable display module.

BACKGROUND OF INVENTION

Active matrix organic light emitting diodes (AMOLEDs) are expected to replace LCDs as a mainstream choice for next generation displays due to high contrast, wide viewing angles, fast response times, and flexibility. Among them, one application of flexible AMOLED screens is applied to splicing foldable screens. In a folding process of splicing the foldable screens, a splicing area needs a certain amount of space to accommodate movement of support mechanisms and the flexible AMOLED screens. After the spliced foldable screens are unfolded, there is a large gap between the two flexible AMOLED screens, which affects display effectiveness.

Therefore, there is a need to provide a technical solution to solve a problem: traditional spliced foldable displays have gaps after flattening and affect the display's effectiveness.

Technical Problem

An objective of the present invention is to provide a foldable display module that can be seamlessly spliced when it is in a flat state.

Technical Solution

In order to achieve the above objective, the present invention provides a foldable display module. The foldable display module comprises a first support mechanism, a second support mechanism, a first flexible screen, a second flexible screen, a first deformable member, and a second deformable member;

wherein the first support mechanism and the second support mechanism are disposed corresponding to each other and movably connected to each other, a gap is defined between the first support mechanism and the second support mechanism, and the first support mechanism and the second support mechanism are hinge-connected to each other;

the first flexible screen is disposed on the first support mechanism and extends to the gap;

the second flexible screen is disposed on the second support mechanism and extends to the gap;

the first deformable member is disposed between the first flexible screen and the first support mechanism, and the second deformable member is disposed between the second flexible screen and the second support mechanism; and when the foldable display module is in a flat state, the first deformable member and the second deformable member both expand in volume, and a portion of the first flexible screen extending to the gap and a portion of the second flexible screen extending to the gap are seamlessly spliced.

In the above foldable display module, when the foldable display module is in a folded state, both the first deformable member and the second deformable member shrink in volume.

In the above foldable display module, both the first deformable member and the second deformable member are airbags.

In the above foldable display module, the foldable display module further comprises a inflation and deflation valve, wherein the first support mechanism and the second support mechanism comprise a receiving cavity, and the inflation and deflation valve is disposed in the receiving cavity; and the inflation and deflation valve is opened and gas is injected into the first deformable member and the second deformable member to expand volume of the first deformable member and the second deformable member.

In the above foldable display module, the foldable display module further comprises a control unit for controlling an open/close state of the inflation and deflation valve.

In the above foldable display module, the foldable display module further comprises a first air pipe, a suction and exhaust device, and a second air pipe, wherein an end of the first air pipe is in communication with air, and another end of the first air pipe is connected to the suction and exhaust device; an end of the second air pipe is connected to the suction and exhaust device, and another end of the second air pipe is connected to the first deformable member and the second deformable member.

In the above foldable display module, when the foldable display module is in the flat state, contact surfaces between the first deformable member and the first flexible screen are planes perpendicular to each other, and contact surfaces between the second deformable member and the second flexible screen are planes perpendicular to each other.

In the above foldable display module, when the foldable display module is in the flat state, a cross-section of the first deformable member and the second deformable member is a right triangle.

In the above foldable display module, both the first flexible screen and the second flexible screen are flexible organic light emitting diode display screens.

Affordable display module. The foldable display module comprises a first support mechanism, a second support mechanism, a first flexible screen, a second flexible screen, a first deformable member, and a second deformable member; wherein the first support mechanism and the second support mechanism are disposed corresponding to each other and movably connected to each other, and a gap is defined between the first support mechanism and the second support mechanism;

the first flexible screen is disposed on the first support mechanism and extends to the gap;

the second flexible screen is disposed on the second support mechanism and extends to the gap;

the first deformable member is disposed between the first flexible screen and the first support mechanism, and the second deformable member is disposed between the second flexible screen and the second support mechanism; and when the foldable display module is in a flat state, the first deformable member and the second deformable member both expand in volume, and a portion of the first flexible screen extending to the gap and a portion of the second flexible screen extending to the gap are seamlessly spliced.

In the above foldable display module, when the foldable display module is in a folded state, both the first deformable member and the second deformable member shrink in volume.

In the above foldable display module, both the first deformable member and the second deformable member are airbags.

In the above foldable display module, both the first deformable member and the second deformable member are provided with a inflation and deflation valve.

In the above foldable display module, the foldable display module further comprises a inflation and deflation valve, wherein the first support mechanism and the second support mechanism comprise a receiving cavity, and the inflation and deflation valve is disposed in the receiving cavity; and the inflation and deflation valve is opened and gas is injected into the first deformable member and the second deformable member to expand volume of the first deformable member and the second deformable member.

In the above foldable display module, the foldable display module further comprises a control unit for controlling an open/close state of the inflation and deflation valve.

In the above foldable display module, the foldable display module further comprises a first air pipe, a suction and exhaust device, and a second air pipe, wherein an end of the first air pipe is in communication with air, and another end of the first air pipe is connected to the suction and exhaust device; an end of the second air pipe is connected to the suction and exhaust device, and another end of the second air pipe is connected to the first deformable member and the second deformable member.

In the above foldable display module, when the foldable display module is in the flat state, contact surfaces between the first deformable member and the first flexible screen are planes perpendicular to each other, and contact surfaces between the second deformable member and the second flexible screen are planes perpendicular to each other.

In the above foldable display module, when the foldable display module is in the flat state, a cross-section of the first deformable member and the second deformable member is a right triangle.

In the above foldable display module, both the first flexible screen and the second flexible screen are flexible organic light emitting diode display screens.

Beneficial Effect

The present invention provides a foldable display module. The foldable display module comprises a first support mechanism, a second support mechanism, a first flexible screen, a second flexible screen, a first deformable member, and a second deformable member. The first support mechanism and the second support mechanism are disposed corresponding to each other and movably connected to each other, and a gap is defined between the first support mechanism and the second support mechanism. The first flexible screen is disposed on the first support mechanism and extends to the gap, and the second flexible screen is disposed on the second support mechanism and extends to the gap. The first deformable member is disposed between the first flexible screen and the first support mechanism, and the second deformable member is disposed between the second flexible screen and the second support mechanism. When the foldable display module is in a flat state, the first deformable member and the second deformable member both expand in volume, and a portion of the first flexible screen extending to a gap and a portion of the second flexible screen extending to the gap are seamlessly spliced. In the present invention, the foldable display module is provided with deformable members disposed between support mechanisms and flexible screens, and the deformable members expand in volume when the foldable display module is in the flat state to enable seamless splicing between the flexible screens to provide a better display experience.

DETAILED DESCRIPTION OF PREFERRED EMBODIMENTS

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

Figure 1:
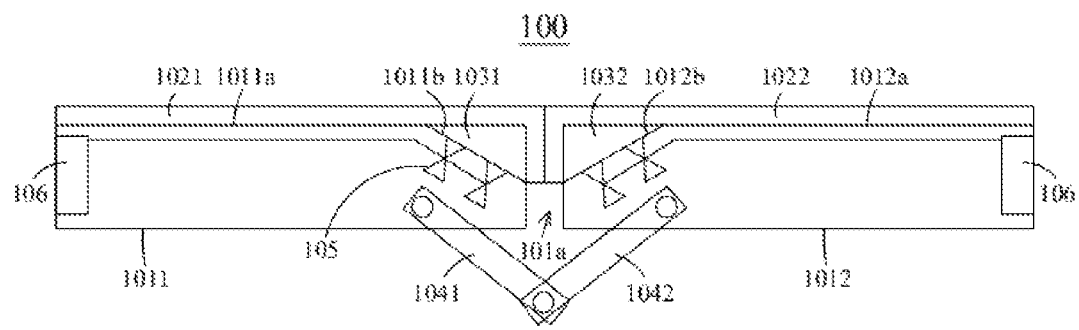
FIG. 1 is a schematic view of a foldable display module in a flat state according to an embodiment of the present invention.
Figure 2:
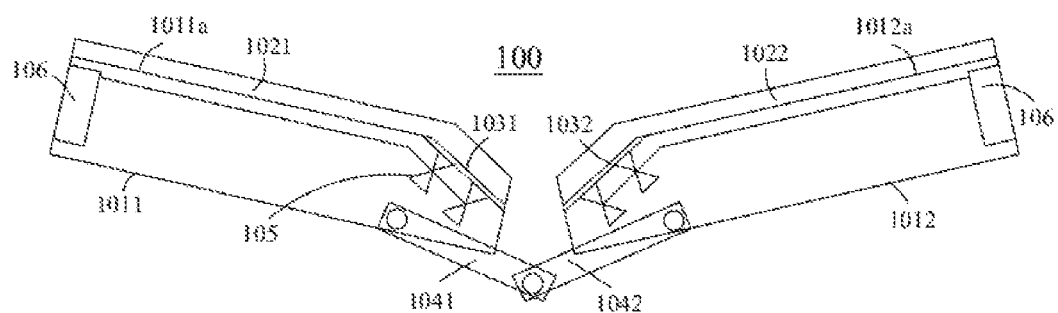
FIG. 2 is a schematic view of the foldable display module shown in FIG. 1 in a folded state.

Please refer to FIG. 1 and FIG. 2. FIG. 1 is a schematic view of a foldable display module in a flat state according to an embodiment of the present invention, and FIG. 2 is a schematic view of the foldable display module shown in FIG. 1 in a folded state. A foldable display module 100 comprises a first supporting mechanism 1011, a second supporting mechanism 1012, a first flexible screen 1021, a second flexible screen 1022, a first deformable member 1031, and a second deformable member 1032.

Both the first flexible screen 1021 and the second flexible screen 1022 are flexible organic light emitting diode display screens. The first flexible screen 1021 and the second flexible screen 1022 comprise a plurality of organic light emitting diodes arranged in an array and a plurality of thin film transistors arranged in an array. The thin film transistors control a light emitting state of the organic light emitting diodes. The thin film transistors comprise inorganic layers, metal layers, etc. Effects of stress can cause display errors in the organic light emitting diodes when the first flexible screen 1021 and second flexible screen 1022 are folded at 90° for a long time.

The first support mechanism 1011 and the second support mechanism 1012 function to support the first flexible screen 1021 and the second flexible screen 1022. The first support mechanism 1011 and the second support mechanism 1012 are disposed corresponding to each other and are movably connected to each other. A gap 101a is defined between the first support mechanism 1011 and the second support mechanism 1012 to provide space for relative movement of the first support mechanism 1011 and the second support mechanism 1012 when folded. The first flexible screen 1021 is disposed on the first support mechanism 1011 and extends to the gap 101a. The second flexible screen 1022 is disposed on the second support mechanism 1012 and extends to the gap 101a.

The first support mechanism 1011 has a first support surface 1011a, and the first support surface 1011a is a flat surface. The first flexible screen 1021 is disposed on the first support surface 1011a. The first flexible screen 1021 can be bonded or snapped onto the first support surface 1011a. The second support mechanism 1012 has a second support surface 1012a, and the second flexible screen 1022 is disposed on the second support surface 1012a. The second flexible screen 1022 can be bonded or snapped onto the second support surface 1012a. The first support mechanism 1011 also has a first inclined surface 1011b. The first inclined surface 1011b is connected to the first support surface 1011a and an angle between the two is greater than 90° and less than 180°. The first deformable member 1031 is disposed on the first inclined surface 1011b, so that when there is no volume shrinkage of the first deformable member 1031, a folding angle of the first flexible screen 1021 is at an obtuse angle to prevent damage to the thin film transistor when the folding angle of the first flexible screen 102 is less than or equal to 90°. The second support mechanism 1012 has a second inclined surface 1012b, and the second inclined surface 1012b is connected to the second support surface 1012a and an angle between the two is greater than 90° and less than 180°. The second deformable member 1032 is disposed on the second inclined surface 1012b.

The first support mechanism 1011 and the second support mechanism 1012 are hinge-connected to each other. The foldable display module 100 comprises a first connecting rod 1041 and a second connecting rod 1042. One end of the first connecting rod 1041 is hinge-connected to the first support mechanism 1011, one end of the second connecting rod 1042 is hinge-connected to the second support mechanism 1012, and the other end of the first connecting rod 1041 is hinge-connected to the other end of the second connecting rod 1042. The first connecting rod 1041 is disposed on a side of the first support mechanism 1011, and the second connecting rod 1042 is disposed on a side of the second support mechanism 1012.

The first deformable member 1031 is disposed between the first flexible screen 1021 and the first support mechanism 1011, and the second deformable member 1032 is disposed between the second flexible screen 1022 and the second support mechanism 1012. Both the first deformable member 1031 and the second deformable member 1032 are airbags. The airbag is inflated when there is no air to expand volume, and the airbag is contracted by deflating when the volume is expanded. The airbag has elasticity. In a natural state of the airbag, gas volume in the airbag is close to 0 and is in a compressed state. The volume of the first deformable member 1031 and the second deformable member 1032 can also be controlled by controlling gas content in the airbag.

As shown in FIG. 1, when the foldable display module 100 is in the flat state, the first deformable member 1031 and the second deformable member 1032 both expand in volume, and a portion of the first flexible screen 1011 extending to the gap 101a and a portion of the second flexible screen 1012 extending to the gap 101a are seamlessly spliced. Specifically, cross-sections of the first deformable member 1031 and the second deformable member 1032 are right triangles. Contact surfaces between the first deformable member 1031 and the first flexible screen 1021 are planes perpendicular to each other, and contact surfaces between the second deformable member 1032 and the second flexible screen 1022 are planes perpendicular to each other, so as to realize seamless splicing of the first flexible screen 1021 and the second flexible screen 1022 when the foldable display module is in the flat state, and provide a good display experience.

As shown in FIG. 2, when the foldable display module 100 is in the folded state, both the first deformable member 1031 and the second deformable member 1032 shrink in volume. There is no right-angle folding between the first flexible screen 1021 and the second flexible screen 1022, so that the thin film transistors in the first flexible screen 1021 and the second flexible screen 1022 are subjected to the least stress, and reduce stress on the foldable display module 100 during folding. When the foldable display module 100 is in the folded state, the angle between the first support mechanism 1011 and the second support mechanism 1012 is less than 180° and greater than or equal to 0°, such as 90°. The volume shrinkage means that: the gas content in the airbag is 0 and at this time the airbag is in a natural state. The volume shrinkage can also means that: The gas in the airbag is less than when the airbag is fully inflated.

A length of the first flexible screen 1021 is equal to a sum of a length of the first support surface 1011a and a length of the first inclined surface 1011b. A length of the second flexible screen 1022 is equal to a sum of a length of the second support surface 1012a and a length of the second inclined surface 1012b. In this way, the foldable display module can be seamlessly spliced in the flat state and there is a smaller area of the flexible screen in the folded state, reducing stress caused by folding on the thin film transistors on the flexible screen.

In the embodiment of the present invention, the foldable display module is provided with deformable members between the support mechanisms and the flexible screens, and the first deformable member and the second deformable member expand in volume when the foldable display module is in the flat state to enable seamless splicing between the first flexible screen and the second flexible screen to provide a better display experience.

The foldable display module 100 further comprises an inflation and deflation valve 105. The first support mechanism 1011 and the second support mechanism 1012 comprise a receiving cavity, and the inflation and deflation valve 105 is disposed in the receiving cavity. When the foldable display module 100 needs to be unfolded for display, the inflation and deflation valve 105 is opened and gas is injected into the first deformable member 1031 and the second deformable member 1032 to expand the volume of the first deformable member 1031 and the second deformable member 1032. After the first deformable member 1031 and the second deformable member 1032 are inflated to a predetermined shape, the inflation and deflation valve 105 is closed. When the foldable display device 100 needs to be folded, the inflation and deflation valve 105 is opened, and the gas in the first deformable member 1031 and the second deformable member 1032 is released. The first deformable member 1031 and the second deformable member 1032 shrink in volume, and the gas in the first deformable member 1031 and the second deformable member 1032 is close to 0 when the foldable display module is folded. There are multiple inflation and deflation valves 105 to quickly realize inflation and deflation.

In the embodiment, the foldable display module 100 further comprises a control unit 106. The control unit 106 is used for controlling an open/close state of the inflation and deflation valve 105. The control unit 106 can be a button. The control unit 106 can be embedded in the first support mechanism and the second support mechanism and set together with volume buttons, etc., or can be integrated into a touch screen control.

Figure 3:
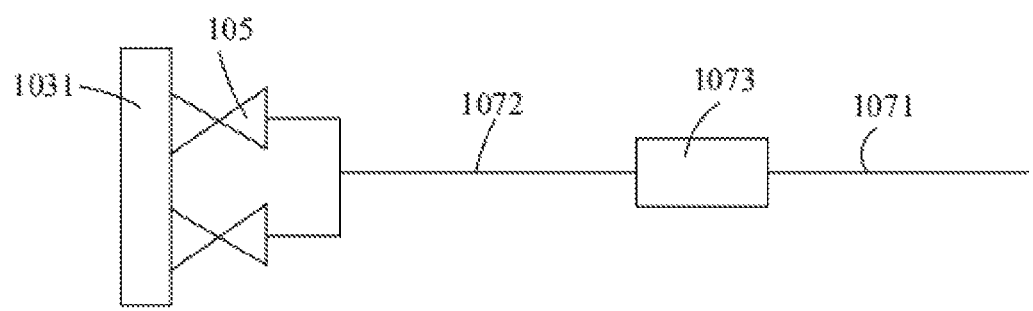
FIG. 3 is a schematic view of a connection between a first deformable member and a suction and exhaust device according to the embodiment of the present invention.

As shown in FIG. 3, which is a schematic view of a connection between the first deformable member and a suction and exhaust device according to the embodiment of the present invention. The foldable display module 100 further comprises a first air pipe 1071, a suction and exhaust device 1073, and a second air pipe 1072. An end of the first air pipe 1071 is in communication with air, and another end of the first air pipe 1071 is connected to the suction and exhaust device 1073. An end of the second air pipe 1072 is connected to the suction and exhaust device 1073, and another end of the second air pipe 1072 is connected to the first deformable member 1031 and the second deformable member 1032. The second air pipe 1072 comprises a primary air pipe and a secondary air pipe, and the inflation and deflation valve 105 is disposed on the secondary air pipe of the second air pipe 1072. The suction and exhaust device 1073 is a suction balloon. The suction and exhaust device 1073 is elastic and fully expands in volume without external force. After applying an external pressure to the suction and exhaust device 1073, the suction and exhaust device 1073 is compressed in volume, removing the applied external pressure. Air enters the first air pipe 1071 to the suction and exhaust device 1073, and the inflation and deflation valve 105 opens. The air is transferred from the suction and exhaust device 1073 to the inflation and deflation valve 105 through the second air pipe 1072, so that the air is injected into the first deformable member 1031, and the first deformable member 1031 expands in volume. A principle of volume expansion of the second deformable member 1032 is the same as that of the first deformable member 1031, and will not be described in detail here. It can be understood that the suction and exhaust device 1073 can also be an electric exhaust device.

The descriptions of the above embodiments are only used to help understand the technical solutions and core ideas of the present invention. Those of ordinary skill in the art should understand that they can still modify the technical solutions described in the embodiments, or equivalently replace some of the technical features. Modifications or substitutions do not deviate the essence of the corresponding technical solutions from the scope of the technical solutions of the embodiments of the present invention.

What is claimed is:

1. A foldable display module, comprising:
   a first support mechanism, a second support mechanism, a first flexible screen, a second flexible screen, a first deformable member, and a second deformable member;
   wherein the first support mechanism and the second support mechanism are disposed corresponding to each other and movably connected to each other, a gap is defined between the first support mechanism and the second support mechanism, and the first support mechanism and the second support mechanism are hinge-connected to each other;
   the first flexible screen is disposed on the first support mechanism and extends to the gap;
   the second flexible screen is disposed on the second support mechanism and extends to the gap;
   the first deformable member is disposed between the first flexible screen and the first support mechanism, and the second deformable member is disposed between the second flexible screen and the second support mechanism; and
   when the foldable display module is in a flat state, the first deformable member and the second deformable member both expand in volume, and a portion of the first flexible screen extending to the gap and a portion of the second flexible screen extending to the gap are seamlessly spliced, wherein when the foldable display module is in a folded state, both the first deformable member and the second deformable member shrink in volume.

2. The foldable display module as claimed in claim 1, wherein both the first deformable member and the second deformable member are airbags.

3. The foldable display module as claimed in claim 2, further comprising an inflation and deflation valve, wherein the first support mechanism and the second support mechanism comprise a receiving cavity, and the inflation and deflation valve is disposed in the receiving cavity; the inflation and deflation valve is opened and a gas is injected into the first deformable member and the second deformable member to expand volume of the first deformable member and the second deformable member.

4. The foldable display module as claimed in claim 3, further comprising a control unit for controlling an open/close state of the inflation and deflation valve.

5. The foldable display module as claimed in claim 2, further comprising a first air pipe, a suction and exhaust device, and a second air pipe, wherein an end of the first air pipe is in communication with air, and another end of the first air pipe is connected to the suction and exhaust device; an end of the second air pipe is connected to the suction and exhaust device, and another end of the second air pipe is connected to the first deformable member and the second deformable member.

6. The foldable display module as claimed in claim 1, wherein when the foldable display module is in the flat state, contact surfaces between the first deformable member and the first flexible screen are planes perpendicular to each other, and contact surfaces between the second deformable member and the second flexible screen are planes perpendicular to each other.

7. The foldable display module as claimed in claim 1, wherein when the foldable display module is in the flat state, a cross-section of the first deformable member and the second deformable member is a right triangle.

8. The foldable display module as claimed in claim 1, wherein both the first flexible screen and the second flexible screen are flexible organic light emitting diode display screens.

9. A foldable display module, comprising:
   a first support mechanism, a second support mechanism, a first flexible screen, a second flexible screen, a first deformable member, and a second deformable member;
   wherein the first support mechanism and the second support mechanism are disposed corresponding to each other and movably connected to each other, and a gap is defined between the first support mechanism and the second support mechanism;
   the first flexible screen is disposed on the first support mechanism and extends to the gap;
   the second flexible screen is disposed on the second support mechanism and extends to the gap;
   the first deformable member is disposed between the first flexible screen and the first support mechanism, and the second deformable member is disposed between the second flexible screen and the second support mechanism; and
   when the foldable display module is in a flat state, the first deformable member and the second deformable member both expand in volume, and a portion of the first flexible screen extending to the gap and a portion of the second flexible screen extending to the gap are seamlessly spliced, wherein when the foldable display module is in the folded state, both the first deformable member and the second deformable member shrink in volume.

10. The foldable display module as claimed in claim 9, wherein both the first deformable member and the second deformable member are airbags.

11. The foldable display module as claimed in claim 10, further comprising a inflation and deflation valve, wherein the first support mechanism and the second support mechanism comprise a receiving cavity, and the inflation and deflation valve is disposed in the receiving cavity; the inflation and deflation valve is opened and a gas is injected into the first deformable member and the second deformable member to expand volume of the first deformable member and the second deformable member.

12. The foldable display module as claimed in claim 11, further comprising a control unit for controlling an open/close state of the inflation and deflation valve.

13. The foldable display module as claimed in claim 10, further comprising a first air pipe, a suction and exhaust device, and a second air pipe, wherein an end of the first air pipe is in communication with air, and another end of the first air pipe is connected to the suction and exhaust device; an end of the second air pipe is connected to the suction and exhaust device, and another end of the second air pipe is connected to the first deformable member and the second deformable member.

14. The foldable display module as claimed in claim 9, wherein when the foldable display module is in the flat state, contact surfaces between the first deformable member and the first flexible screen are planes perpendicular to each other, and contact surfaces between the second deformable member and the second flexible screen are planes perpendicular to each other.

15. The foldable display module as claimed in claim 9, wherein when the foldable display module is in the flat state, a cross-section of the first deformable member and the second deformable member is a right triangle.

16. The foldable display module as claimed in claim 9, wherein both the first flexible screen and the second flexible screen are flexible organic light emitting diode display screens.

\* \* \* \* \*